United States Patent
Ahmed et al.

(10) Patent No.: US 9,450,597 B1
(45) Date of Patent: Sep. 20, 2016

(54) HARDWARE BASED COMPRESSIVE SAMPLING ADC ARCHITECTURE FOR NON-UNIFORM SAMPLED SIGNAL RECOVERY

(71) Applicant: HRL LABORATORIES, LLC, Malibu, CA (US)

(72) Inventors: Mohiuddin Ahmed, Moorpark, CA (US); Shankar R. Rao, Agoura Hills, CA (US); Willie W. Ng, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/702,294

(22) Filed: May 1, 2015

Related U.S. Application Data

(60) Provisional application No. 61/988,133, filed on May 2, 2014, provisional application No. 62/147,493, filed on Apr. 14, 2015, provisional application No. 62/147,473, filed on Apr. 14, 2015.

(51) Int. Cl.
    *H03M 1/12* (2006.01)
    *G02F 7/00* (2006.01)
    *H03M 1/06* (2006.01)

(52) U.S. Cl.
    CPC .............. *H03M 1/123* (2013.01); *G02F 7/00* (2013.01); *H03M 1/0629* (2013.01); *H03M 1/128* (2013.01); *H03M 1/1245* (2013.01)

(58) Field of Classification Search
    CPC ............. G02F 1/01; G02F 1/21; G02F 7/00; H03M 1/12; H03M 1/125; H03M 1/1265; H03M 1/128; H03M 7/3062
    USPC ........................................................ 341/137
    See application file for complete search history.

(56) References Cited

U.S. PATENT DOCUMENTS

| | | |
|---|---|---|
| 5,004,342 A | 4/1991 | Bernard et al. |
| 5,327,215 A | 7/1994 | Bernard et al. |
| 5,414,548 A | 5/1995 | Tachikawa et al. |
| 6,052,495 A | 4/2000 | Little et al. |
| 6,157,274 A | 12/2000 | Tada et al. |
| 6,160,826 A | 12/2000 | Swanson et al. |
| 6,185,345 B1 | 2/2001 | Singh et al. |
| 6,636,668 B1 | 10/2003 | Al-hemyari et al. |
| 6,668,006 B1 | 12/2003 | Margalit et al. |
| 6,681,065 B1 | 1/2004 | Minasian et al. |
| 6,724,512 B2 | 4/2004 | Carlson et al. |
| 6,852,556 B2 | 2/2005 | Yap |

(Continued)

OTHER PUBLICATIONS

Chen et al., Sub-Nyquist Sampled Analog-to-Digital Conversion Based on Photonic Time Stretch and Compressive Sensing With Optical Random Mixing. IEEE, Journal of Lightwave Technology, vol. 31, No. 21, Nov. 1, 2013.*

(Continued)

*Primary Examiner* — Howard Williams
(74) *Attorney, Agent, or Firm* — Ladas & Parry

(57) ABSTRACT

A back end-circuit for randomized non uniform and alias-free subsampling, comprising: an analog-to-digital converter (ADC) configured for sampling an input signal at random non uniform times; a compressive sensing processor, coupled to the ADC, to recover a sparse spectral representation of the input signal; and a Fourier transformer for converting the sparse spectral representation to a time sampled representation of the input signal.

11 Claims, 6 Drawing Sheets

(56) References Cited

U.S. PATENT DOCUMENTS

| | | | |
|---|---|---|---|
| 6,870,968 B2 | 3/2005 | Griffin | |
| 6,872,985 B2 | 3/2005 | Yap | |
| 6,970,619 B2 | 11/2005 | Baumann et al. | |
| 6,992,539 B1 | 1/2006 | How | |
| 7,085,438 B2 | 8/2006 | Mizuno et al. | |
| 7,190,858 B1 | 3/2007 | Greiner et al. | |
| 7,215,848 B2 | 5/2007 | Tan et al. | |
| 7,266,258 B2 | 9/2007 | Liu et al. | |
| 7,269,312 B2 | 9/2007 | Ng et al. | |
| 7,423,564 B2 | 9/2008 | Kitayama et al. | |
| 7,440,653 B2 | 10/2008 | Smith et al. | |
| 7,447,387 B2 | 11/2008 | Shih et al. | |
| 7,509,048 B2 | 3/2009 | Turpin et al. | |
| 7,525,466 B2 * | 4/2009 | Vanderhaegen | H03M 1/1265 341/144 |
| 7,561,605 B1 | 7/2009 | Delfyett et al. | |
| 7,570,184 B2 | 8/2009 | Ikeda et al. | |
| 7,613,399 B2 | 11/2009 | Yasumoto et al. | |
| 8,019,185 B2 | 9/2011 | Yap | |
| 8,275,263 B1 | 9/2012 | Franklin | |
| 8,334,797 B1 | 12/2012 | Ng et al. | |
| 8,471,750 B2 * | 6/2013 | Rogers | H03M 1/128 341/155 |
| 8,750,438 B2 * | 6/2014 | Gupta | H03M 7/3062 375/346 |
| 9,052,534 B2 | 6/2015 | Sudo et al. | |
| 2004/0114867 A1 | 6/2004 | Nielsen et al. | |
| 2004/0228564 A1 | 11/2004 | Gunn et al. | |
| 2005/0286602 A1 | 12/2005 | Gunn et al. | |
| 2006/0083456 A1 | 4/2006 | Burns et al. | |
| 2006/0215949 A1 | 9/2006 | Lipson et al. | |
| 2007/0009205 A1 | 1/2007 | Maleki et al. | |
| 2007/0206899 A1 | 9/2007 | Chu et al. | |
| 2007/0230856 A1 | 10/2007 | Yamazaki | |
| 2008/0080803 A1 | 4/2008 | Park et al. | |
| 2009/0034905 A1 | 2/2009 | Ty Tan et al. | |
| 2009/0208209 A1 | 8/2009 | Ng et al. | |
| 2010/0158429 A1 | 6/2010 | Popovic | |
| 2010/0201345 A1 | 8/2010 | Gupta et al. | |
| 2012/0200439 A1 | 8/2012 | Hartl et al. | |
| 2013/0315597 A1 * | 11/2013 | Shaver | H04J 14/0227 398/79 |
| 2013/0328706 A1 | 12/2013 | Marom | |

OTHER PUBLICATIONS

Airola et al., Experimental Demonstration of a Photonic Analog-to-Digital Converter Architecture With Pseudorandom Sampling, IEEE Photonics Technology Letters, vol. 20, No. 24, Dec. 15, 2008.*

Candes et al. An Introduction to Compressive Sampling, IEEE Signal Processing Magazine Mar. 21, 2008.*

Baltimore and Walden, R., "Analog-to-Digital Conversion in the Early Twenty-First Century," *Wiley Encyclopedia of Computer Science and Engineering*, John Wiley & Sons, Inc., pp. 1-14, (2008).

Baraniuk, R., "Compressive Sensing," *IEEE Signal Processing Magazine*, pp. 118-124, (Jul. 2007).

Borrelli et al., "Direct Measurement of 248- and 193-nm excimer-induced densification in silica-germania waveguide blanks," *J. Opt. Soc. Am. B*, vol. 16, No. 10, pp. 1672-1679, (Oct. 1999).

Chou et al., "4-Channel Continuous-Time 77 GSa/s ADC using Photonic Bandwidth Compression," *IEEE International Topical Meeting on Microwave Photonics*, pp. 54-57, (Oct. 2007).

Chou et al., "Photonic Bandwidth Compression Front End for Digital Oscilloscopes," *IEEE Journal of Lightwave Technology*, vol. 27, No. 22, pp. 5073-5077, (Nov. 15, 2009).

Djordjev et al., "Microdisk Tunable Resonant Filters and Switches," *IEEE Photonics Technology Letters*, vol. 14, No. 6, pp. 828-830, (Jun. 2002).

Driessen et al., "Microresonators as promising building blocks for VLSI photonics," *Proc. of SPIE*, vol. 5956, pp. 59560Q1-59560Q14, (2005).

Gupta, S. and Jalali, B., "Time-Warp Correction and Calibration in Photonic Time-Stretch Analog-to-Digital Converter," *Optics Letters*, vol. 33, No. 22, pp. 2674-2676, (Nov. 15, 2008).

Gupta et al., "Distortion Cancellation in Time-Stretch Analog-to-Digital Converter," *IEEE Journal of Lightwave Technology*, vol. 25 No. 12, pp. 3716-3721, (Dec. 2007).

Han et al., "Photonic Time-Stretched Analog-to-Digital Converter: Fundamental Concepts and Practical Considerations," *IEEE Journal of Lightwave Technology*, vol. 21 No. 12, pp. 3085-3103, (Dec. 2003).

U.S. Appl. No. 14/702,195, Ng et al.

Hill, K. and Meltz, G., "Fiber Bragg Grating Technology Fundamentals and Overview," *IEEE Journal of Lightwave Technology*, vol. 15, No. 8, pp. 1263-1276, (Aug. 1997).

Hunt et al., "Active Optical Lattice Filters," *EURASIP Journal on Applied Signal Processing*, 2005:10, pp. 1452-1461, (2005).

Itoh et al., "Ultrafast Processes for Bulk Modification of Transparent Materials," *MRS Bulletin*, vol. 31, pp. 620-625, (Aug. 2006).

Jinguji, K. and Kawachi, M., "Synthesis of Coherent Two-Port Lattice-Form Optical Delay-Line Circuit," *Journal of Lightwave Technology*, vol. 13, No. 1, pp. 73-82, (Jan. 1995).

Jinguji, K., "Synthesis of Coherent Two-Port Optical Delay-Line Circuit with Ring Waveguides," *Journal of Lightwave Technology*, vol. 14, No. 8, pp. 1882-1898, (Aug. 1996).

Jinguji, K. and Oguma, M., "Optical Half-Band Filters," *Journal of Lightwave Technology*, vol. 18, No. 2, pp. 252-259, (Feb. 2000).

Kannan et al., "Analysis and Design of Active Optical Filter Structures With Two-Port Couplers," *IEEE Journal of Lightwave Technology*, vol. 24, No. 71, pp. 2637-2648, (Jul. 2006).

Leconte et al., "Analysis of Color-Center-Related Contribution to Bragg Grating Formation in Ge:SiO2 Fiber Based on a Local Kramers-Kronig Transformation of Excess Loss Spectra," *Applied Optics*, vol. 36, No. 24, pp. 5923-5930, (Aug. 20, 1997).

Little et al., "Microring Resonator Channel Dropping Filters," *IEEE Journal of Lightwave Technology*, vol. 15, No. 6, pp. 998-1005, (Jun. 1997).

Madsen, C., "Efficient Architectures for Exactly Realizing Optical Filters with Optimum Bandpass Designs," *IEEE Photonics Technology Letters*, vol. 10, No. 8, pp. 1136-1138, (Aug. 1998).

Madsen, C., "General IIR Optical Filter Design for WDM Applications Using All-Pass Filters," *Journal of Lightwave Technology*, vol. 18, No. 6, pp. 860-868, (Jun. 2000).

Nasu et al., "Low-Loss Waveguides Written with a Femtosecond Laser for Flexible Interconnection in a Planar Light-Wave Circuit," *Optics Letters*, vol. 30, No. 7, pp. 723-725, (Apr. 1, 2005).

Ng et al., "Demonstration of a Large Stretch-Ratio (M=41) Photonic Analog-to-Digital Converter with 8 ENOB for an Input Signal Bandwidth of 10 GHz," *IEEE Photonic Technology Letters*, vol. 24, No. 14, pp. 1185-1187, (Jul. 15, 2012).

Sefler, G., Conway, J., and Valley, G., "Wide-Bandwidth, High-Resolution ADC Scalable to Continuous-Time Operation," *Conference on Lasers and Electro-Optics (CLEO)*, (2009).

Soref, R. and Bennett, B., "Kramers-Kronig Analysis of Electro-Optical Switching in Silicon," *Integrated Optical Circuit Engineering IV*, vol. 704, pp. 32-37, (Sep. 16-17, 1986).

Tropp et al., "Beyond Nyquist: Efficient Sampling of Sparse Bandlimited Signals", *IEEE Transactions on Information Theory*, vol. 56, No. 1, pp. 520-544, (Jan. 2010).

Tropp et al., "Computational Methods for Sparse Solution of Linear Inverse Problems," *Proceedings of the IEEE*, vol. 98, No. 6, pp. 948-958, (Jun. 2010).

Valley et al., "Continuous Time Realization of Time-Stretch ADC," *IEEE, International Topical Meeting on Microwave Photonics*, pp. 1-3, (Oct. 2006).

Wakin et al., "A Nonuniform Sampler for Wideband Spectrally-Sparse Environments," *IEEE Journal on Emerging and Selected Topics in Circuits and Systems*, vol. 2, No. 3, pp. 516-529, (Sep. 2012).

Walden, R.H., "Analog-to-Digital Conversion in the Early Twenty-First Century," *Wiley Encyclopedia of Computer Science and Engineering*, pp. 1-14, (2008).

(56) References Cited

OTHER PUBLICATIONS

Yariv, A., "Universal Relations for Coupling of Optical Power Between Microresonators and Dielectric Waveguides," *Electronics Letters*, vol. 36, No. 4, pp. 321-322, (Feb. 17, 2000).
From U.S. Appl. No. 12/131,088 (Now U.S. Pat. No. 8,019,185), Restriction/Election mailed on Jan. 12, 2009.
From U.S. Appl. No. 12/131,088 (Now U.S. Pat. No. 8,019,185), Non-Final Rejection mailed on Feb. 5, 2009.
From U.S. Appl. No. 12/131,088 (Now U.S. Pat. No. 8,019,185), Non-Final Rejection mailed on Jul. 29, 2009.
From U.S. Appl. No. 12/131,088 (Now U.S. Pat. No. 8,019,185), Final Rejection mailed on Jan. 4, 2010.
From U.S. Appl. No. 12/131,088 (Now U.S. Pat. No. 8,019,185), Non-Final Rejection mailed on Jul. 13, 2010.
From U.S. Appl. No. 12/131,088 (Now U.S. Pat. No. 8,019,185), Final Rejection mailed on Nov. 2, 2010.
From U.S. Appl. No. 12/131,088 (Now U.S. Pat. No. 8,019,185), Advisory Action mailed on Jan. 11, 2011.
From U.S. Appl. No. 12/131,088 (Now U.S. Pat. No. 8,019,185), Non-Final Rejection mailed on Jan. 26, 2011.
From U.S. Appl. No. 12/131,088 (Now U.S. Pat. No. 8,019,185), Notice of Allowance mailed on May 9, 2011.
From U.S. Appl. No. 12/183,064 (Now U.S. Pat. No. 8,331,743), Restriction/Election mailed on Jun. 15, 2011.
From U.S. Appl. No. 12/183,064 (Now U.S. Pat. No. 8,331,743), Non-Final Rejection mailed on Sep. 30, 2011.
From U.S. Appl. No. 12/183,064 (Now U.S. Pat. No. 8,331,743), Final Rejection mailed on Mar. 19, 2012.
From U.S. Appl. No. 12/183,064 (Now U.S. Pat. No. 8,331,743), Advisory Action mailed on Jul. 6, 2012.
From U.S. Appl. No. 12/183,064 (Now U.S. Pat. No. 8,331,743), Notice of Allowance mailed on Aug. 3, 2012.
From U.S. Appl. No. 12/560,409 (Now U.S. Pat. No. 8,270,792), Notice of Allowance mailed on May 22, 2012.
From U.S. Appl. No. 12/763,965 (Now U.S. Pat. No. 8,334,797), Non-Final Rejection mailed on Nov. 9, 2011.
From U.S. Appl. No. 12/763,965 (Now U.S. Pat. No. 8,334,797), Final Rejection mailed on Apr. 26, 2012.
From U.S. Appl. No. 12/763,965 (Now U.S. Pat. No. 8,334,797), Notice of Allowance mailed on Aug. 15, 2012.
From U.S. Appl. No. 13/114,594 (Now U.S. Pat. No. 8,244,077), Restriction/Election mailed on Sep. 8, 2011.
From U.S. Appl. No. 13/114,594 (Now U.S. Pat. No. 8,244,077), Non-Final Rejection mailed on Oct. 20, 2011.
From U.S. Appl. No. 13/114,594 (Now U.S. Pat. No. 8,244,077), Final Rejection mailed on Nov. 28, 2011.
From U.S. Appl. No. 13/114,594 (Now U.S. Pat. No. 8,244,077), Notice of Allowance mailed on Apr. 4, 2012.
From U.S. Appl. No. 14/702,195 (Unpublished, Non-Publication Requested), Restriction/Election mailed on Aug. 6, 2015.
From U.S. Appl. No. 14/702,195 (Unpublished, Non-Publication Requested), Non-Final Rejection mailed on Dec. 8, 2015.

* cited by examiner $$y[n] = \begin{bmatrix} 1\cdots1 & & & \\ & 1\cdots1 & \overset{\frac{W}{R}}{\longleftrightarrow} & \\ & & \ddots & \\ & & & 1\cdots1 \end{bmatrix} \begin{bmatrix} \pm1 & & \\ & \ddots & \\ & & \pm1 \end{bmatrix} \begin{bmatrix} \text{DFT} \\ \text{matrix} \\ W \times W \end{bmatrix} \begin{bmatrix} \vdots \\ a'_\omega \\ \vdots \end{bmatrix}$$

H　　　　　　　D　　　　F　　　a

HARDWARE BASED COMPRESSIVE SAMPLING ADC ARCHITECTURE FOR NON-UNIFORM SAMPLED SIGNAL RECOVERY

CROSS-REFERENCE TO RELATED APPLICATIONS

This application claims the benefit of provisional application Ser. No. 61/988,133, entitled "A CONTROLLABLE OPTO-ELECTRONIC TIME STRETCHER, AN ELECTRO-OPTICAL ANALOG TO DIGITAL CONVERTER HAVING NON-UNIFORM SAMPLING USING THE SAME, AND RELATED METHODS OF OPERATION" and filed on May 2, 2014, which is hereby incorporated by reference.

This application claims the benefit of provisional application Ser. No. 62/147,493, entitled "A CONTROLLABLE OPTO-ELECTRONIC TIME STRETCHER, AN ELECTRO-OPTICAL ANALOG TO DIGITAL CONVERTER HAVING NON-UNIFORM SAMPLING USING THE SAME, AND RELATED METHODS OF OPERATION" and filed on Apr. 14, 2015, which is hereby incorporated by reference.

This application claims the benefit of provisional application Ser. No. 62/147,473, entitled "HARDWARE BASED COMPRESSIVE SAMPLING ADC ARCHITECTURE FOR NON-UNIFORM SAMPLED SIGNAL RECOVERY" and filed on Apr. 14, 2015, which is hereby incorporated by reference.

INCORPORATION BY REFERENCE

The present disclosure relates to U.S. Pat. No. 8,334,797, issued on Dec. 18, 2012 and entitled: "Wideband High Resolution Time-Stretched Photonic Analog-to-Digital Converter", which is hereby incorporated by reference.

BACKGROUND OF THE INVENTION

1. Field of the Invention

The present invention relates to a compressive sensing (CS) approach for reconstructing a signal x(t) that has been randomly and non uniformly sampled and digitized. More specifically, the present invention relates to an approach for reconstructing a signal obtained using a photonic TS ADC in conjunction with non uniform sampling (NUS) using CS techniques.

2. Discussion of the Related Art

Digitizing high frequency and/or high bandwidth signals is a desired operation. Apparatus requiring such operations include test and measurement equipment in laboratories, high speed data communications systems, and electronic support measure systems (ESM) that can demonstrate a high probability of intercept (POI), large dynamic range, and good sensitivity over a signal having a wide Instantaneous BandWidth (IBW). Such operations are also applicable to software-defined radio architectures that can unify common back-end digital processing for transceiver operations in e.g. an automobile.

A photonic TS ADC (Time-Stretch Analog-to-Digital Converter) can provide continuous time (CT) processing, while delivering a high Effective-Number-Of-Bits (ENOB) of >8 over an IBW of 10 GHz. FIG. 1 is a schematic diagram of a conventional (uniformly sampled) photonic TS ADC system.

The system of FIG. 1 implements multiple λ-channels to accomplish signal de-serialization before A/D conversion. The number of parallel λ-channels needed to accomplish CT A/D conversion in such a system is directly proportional to the stretch ratio M, where $M=1+D_2/D_1$. In simulations, photonic TS ADC systems with a large stretch-ratio M of M around 41 resulted in a digitized output signal having an effective number of bits (ENOB) that is >8 for an input signal frequency ($f_{sig}$) of 10 GHz. A large stretch ratio (M) is important to producing a high ENOB. However, a TS ADC system constructed with a stretch ratio of 41 may require a large number of parallel channels to accomplish continuous time (CT) operation. Specifically, the number of parallel ADC-channels required to form a CT TS ADC system is directly proportional to M as illustrated in FIG. 1.

FIG. 2 is a schematic diagram of an ADC system termed a random demodulator (RD) described in a document from Tropp et al, entitled "Beyond Nyquist: Efficient Sampling of Sparse Bandlimited Signals", IEEE Transactions on Information Theory, Vol. 56, No. 1, 2010"; for the compressive sensing of a wideband analog input-signal. In FIG. 2, an input signal f(t) is coupled to a first input terminal of a mixer 302, and a pseudorandom generator 304 is coupled to a second input terminal of the mixer 302. An input terminal of the pseudorandom generator 304 is coupled to a source of a seed value for controlling the pseudorandom sequence. An output terminal of the mixer 302 is coupled to an input terminal of an integrator 306. An output terminal of the integrator 306 is coupled to an input terminal of a sampler 308, where the components 306 and 308 behave the same way as a standard ADC. An output terminal of the analog-to-digital converter 306-308 generates a sampled digital output signal y[n].

To permit signal reconstruction via use of compressive sensing (CS), the analog input signal f(t) is assumed to be a frequency-sparse signal. As illustrated in FIG. 2, a pseudorandom chip-sequence $p_c(t)$ from pseudorandom generator 304, switched at a rate W between random amplitudes of ±1, is mixed in mixer 302 with the analog input signal f(t). The mixed signal is fed to integrator 306. The output of integrator 306 provides a randomized projection (i.e., a randomized linear combination) of the mixed product of f(t) and $p_c(t)$ over an integration time-interval of 1/R, where R is the clock rate of the cascaded ADC chip. Because the chip-rate of $p_c(t)$ is W, W/R randomized chips are mixed together (via integration) to form the input of a sampler chip 308 that follows the integrator 306 (the "chip-sequence" being the pseudorandom code-sequence $p_c(t)$ (typically ±1) generated by the Pseudorandom Generator in the figure and the chip-rate being the number of pulses/sec at which the code is generated.). It is to be noted that although there are $M_d$ row-elements in the "measured" output, each row-element is obtained, after integration, over successive sampling time-intervals $nT_s$. The sampler 308 chip is clocked uniformly at a rate R. As detailed hereafter, CS based techniques are used to calculate sparse Fourier coefficients ('a'ω of [a]) of f(t) from the measured output of the ADC 306, 308.

As detailed in the Tropp et al. document, compressive sensing (CS) techniques can use a matrix form model of the random demodulator (RD) of FIG. 2. FIG. 3 is a matrix diagram illustrating a CS matrix formalism representing the RD system architecture depicted in FIG. 2. CS based techniques can be used to calculate sparse Fourier coefficients ("a'ω" of [a]) of f(t) from the measured output of the ADC. The input signal $x_n$ is eventually recovered via use of a W×W DFT that transforms the sparse vector (denoted [a] in FIG. 3) back to the time-domain. The compression ratio of this random demodulation scheme is given by W/R. Because the sampling rate R of the ADC-chip can be much lower than the Nyquist sampling rate of the input signal f(t), the CS compression ratio of a RD can be >10. For example, an input harmonic signal f(t) at 800 kHz may be recovered from ADC measurements that are clocked at 100 kHz, which was 1/16 the Nyquist sampling rate $f_N$.

The mixing of $p_c(t)$ and f(t) may randomize the amplitudes of the input signal (at the chip rate W) in the RD approach, and the sensing bandwidth of a RD architecture may be limited by that of the mixer.

FIG. 4 is a schematic diagram of an all-electronic approach for implementing NUS via use of a S/H and Pseudo Random Bit (PSRB) timing generator, such as described for example in a document from M. Wakin, et al, entitled "A Non-Uniform Sampler for Wideband Spectrally-Sparse Environments", to be published in JESTCS". In FIG. 4, a signal input terminal of a main sample-and-hold (MSH) circuit 502 is coupled to a source of an analog input signal $A_{in}$. An output terminal of the MSH circuit 502 is coupled to a signal input terminal of a subsampling sample and hold (SSH) circuit 504. An output terminal of the SSH circuit 504 produces an analog output signal $A_{out}$ and is coupled to a signal input terminal of an analog-to-digital converter (ADC) 508. An output terminal of the ADC 508 generates a digital output signal $D_{out}$.

A first input terminal of a timing generator 506 is coupled to a source of a clock signal $C_{in}$, and a second input terminal of the timing generator 506 is coupled to a source of a sampling clock signal $N_{in}$. A first output terminal of the timing generator 506 is coupled to a timing input terminal of the MSH circuit 502; a second output terminal of the timing generator 506 is coupled to a timing input terminal of the subsampling S/H 504; and a third output terminal of the timing generator 506 is coupled to a timing input terminal of the ADC 508. One skilled in the art understands that other elements may be necessary for the proper operation of the system illustrated in FIG. 4, such as buffer amplifiers. The skilled practitioner will understand what those elements are, where they should be located, and how to design and build those elements. One skilled in the art further understands that the ADC 508 may be implemented by a commercial off-the-shelf component.

In operation, the analog input signal $A_{in}$ is a frequency $f_{sig}$ having a bandwidth of around 0.8-2 GHz. This signal is digitized by subsampling randomly at an average rate $(f_s)_{AV}$ of 0.236 GHz. The input signal is reconstructed from the ADC 508 output via use of compressive sensing techniques. The all-electronic NUS approach illustrated in FIG. 4 is implemented with a sample/hold (S/H) frontend, i.e. the main sample and hold MSH circuit 502, samples the input signal $A_{in}$ at the Nyquist rate or higher. Samples are then randomly discarded, e.g. keeping on the average of one of every 19 samples, by the SSH 504 in response to a synchronized pseudo-random bit (PSRB) sequence from the timing generator 506 to simulate randomized NUS.

It is noted that the system of FIG. 4 is implemented with a Nyquist rate S/H, i.e. MSH 502, and it would be difficult to scale to a signal with a wider IBW without incurring clock jitter issues. In addition, the chip also uses on-grid A/D conversion, making it difficult to obtain performance advantages.

Improvements may therefore be made over the conventional systems discussed above. More specifically, an ADC system which can produce a digital representation of a frequency sparse signal which may have a wide instantaneous bandwidth, while maintaining a suitable of equivalent number of bits with a minimum of circuitry, is desirable. A CT ADC system using CS techniques designed with reduced channel count may decrease data-throughput along with simplified hardware construction. This, in turn, may facilitate the deployment of digital channelized receivers, reduce costs, and produce improved computational results.

BRIEF SUMMARY OF THE INVENTION

The inventors have realized that, as discussed above, a reconstruction method for a signal from random non-uniform samples provides substantive advantages. Specifically, for an input signal derived from a frequency-sparse RF-spectrum, such a method enables the reconstruction of the input signal with use of compressive sensing based algorithms.

Embodiments of the present disclosure comprise a hardware compressive sensing ADC architecture and signal recovery technique that can accomplish spectral sensing of analog signals that occupy a wide IBW, but are frequency-sparse. In accordance with embodiments of the present disclosure a photonic time-stretched back end-architecture for randomized non uniform and alias-free subsampling, includes a source of an input signal. A photonic time-stretched analog-to-digital converter (ADC) is coupled to the input signal source, and includes variable time dispersive media for sampling an input signal at random non uniform times. A compressive sensing processor, coupled to the ADC, may be configured to recover a sparse spectral representation of the input signal. A Fourier transformer may be configured for converting the sparse spectral representation to a time sampled representation of the input signal.

The photonic TS approach of the present disclosure enables compression of the input signal bandwidth, so that A/D conversion may be performed at a much lower sampling rate of $2f_{sig}/M$, compared to the Nyquist rate of $2f_{sig}$. The additional implementation of non uniform subsampling in such a TS system enables further reduction of the clock rate R of the ADC due to alias reduction. It also enables sensing an even wider IBW. For example, an IBW 10 GHz wide may be sensed by an ADC bank that randomly samples a TS signal (with M=20) at an average sampling rate of $f_s$=1 GHz by combining time-stretching and NUS. The RF spectrum processed by such a TS may be an order of magnitude higher or more than the RD approach.

In the system illustrated in FIG. 2 and FIG. 3, the mixing of $p_c(t)$ and f(t) randomizes the amplitudes of the input signal (at the chip rate W) in the RD approach described. An embodiment of the present disclosure randomizes the sampling times of the input signal. Specifically, the matrix formalism according to embodiments of the present disclosure models the randomization of sampling times—rather than amplitudes. Further, the sensing bandwidth of an RD architecture is limited by that of the mixer. Referring to the ADC hardware illustrated in FIG. 4, because it is substantially different from the TS architecture according to embodiments of the present disclosure (as illustrated for example in FIG. 5 hereafter), the OMP signal recovery algorithm used in the system of FIG. 4 is substantially different from a CS algorithm of embodiments of the present disclosure.

An embodiment of the present disclosure relates to a back end-circuit for randomized non uniform and alias-free subsampling, comprising: an analog-to-digital converter (ADC) configured for sampling an input signal at random non uniform times; a compressive sensing processor, coupled to the ADC, to recover a sparse spectral representation of the input signal; and a Fourier transformer for converting the sparse spectral representation to a time sampled representation of the input signal.

According to an embodiment of the present disclosure, said sampling at random non uniform times has a sampling rate below the Nyquist rate.

According to an embodiment of the present disclosure, the ADC comprises a photonic time-stretch random non uniform sampling ADC including a variable dispersive medium.

According to an embodiment of the present disclosure, said analog-to-digital converter (ADC) is configured for time-stretching the input signal prior to sampling the input signal at random non uniform times.

According to an embodiment of the present disclosure, said analog-to-digital converter (ADC) is configured for randomly time-stretching the input signal prior to sampling the input signal at uniform times.

According to an embodiment of the present disclosure, said compressive sensing processor is provided for, using a compressive sensing algorithm, recovering said sparse spectral representation of the input signal by, considering that the output of said ADC is equal to said sparse spectral representation of the input signal multiplied by a DFT matrix, multiplied by a random sampling matrix, multiplied by a mixing matrix.

According to an embodiment of the present disclosure, said sparse spectral representation of the input signal comprises N-entries; said output of said ADC comprises Md, where Md<<N, said DFT matrix is a N by N matrix; said random sampling is a N by N matrix, said matrix being partitioned into a plurality of sampling blocks and zero entries, in which the plurality of sampling blocks contain a plurality of entries in which one entry in each sampling block is selected to be 1 in accordance with a probability distribution function having a mean and standard deviation, and the remainder of entries in that sampling block are 0; and said mixing matrix is a Md by N matrix, where the m+1 th row has N/Md of consecutive unit entries starting in column (mN/Md)+1 for each m=0, 1, Md−1, representing mixing of a plurality of samples of the input signal.

According to an embodiment of the present disclosure, the compressive sensing processor implements one of an $l_1$ or orthogonal matching pursuit (OMP) compressive sensing technique.

An embodiment of the present disclosure relates to a processor-implemented method for reconstructing a randomly sampled input signal, comprising executing on a processor the steps of: generating a N-entries sparse spectral vector representing a sparse spectral representation of a randomly sampled input signal; and transforming the sparse spectral vector to a Md-entries time sampled representation of the input signal using a N by N DFT matrix; wherein said generating a N-entries parse spectral vector comprises: receiving a Md entries sparse time vector representing random samples of the input signal uniformly arranged in time, where Md<<N; generating a random sampling N by N matrix, representing a random sampling of the input signal, said matrix being partitioned into a plurality of sampling blocks and zero entries, in which the plurality of sampling blocks contain a plurality of entries in which one entry in each sampling block is selected to be 1 in accordance with a probability distribution function having a mean and standard deviation, and the remainder of entries in that sampling block are 0; generating a Md by N mixing matrix, where the m+1 th row has N/Md of consecutive unit entries starting in column (mN/Md)+1 for each m=0, 1, Md−1, representing mixing of a plurality of samples of the input signal; and using a compressive sensing algorithm, generating said N-entries sparse spectral vector from the Md entries sparse time vector, considering that said Md entries sparse time vector is the N-entries sparse spectral vector multiplied by the N by N DFT matrix, multiplied by the random sampling N by N matrix, multiplied by the Md by N mixing matrix.

According to an embodiment of the present disclosure, said compressive sensing algorithm is one of an $l_1$ or orthogonal matching pursuit (OMP) algorithm.

According to an embodiment of the present disclosure, the N by N random sampling matrix represents a random sampling of a set of N regularly distributed samples of an input signal, wherein the multiplication of a vector representing a set of N regularly distributed samples of an input signal by the random sampling matrix produces a randomly sampled vector of same size N having randomly chosen entries replaced by zeros.

DETAILED DESCRIPTION OF THE INVENTION

Embodiments of the present disclosure utilize random non uniform photonic time-stretch sampling to obtain samples which are processed by compressive sensing techniques. As discussed above, randomized NUS permits alias-free sub-sampling of an analog-input $V_{in}(t)$.

Figure 1:
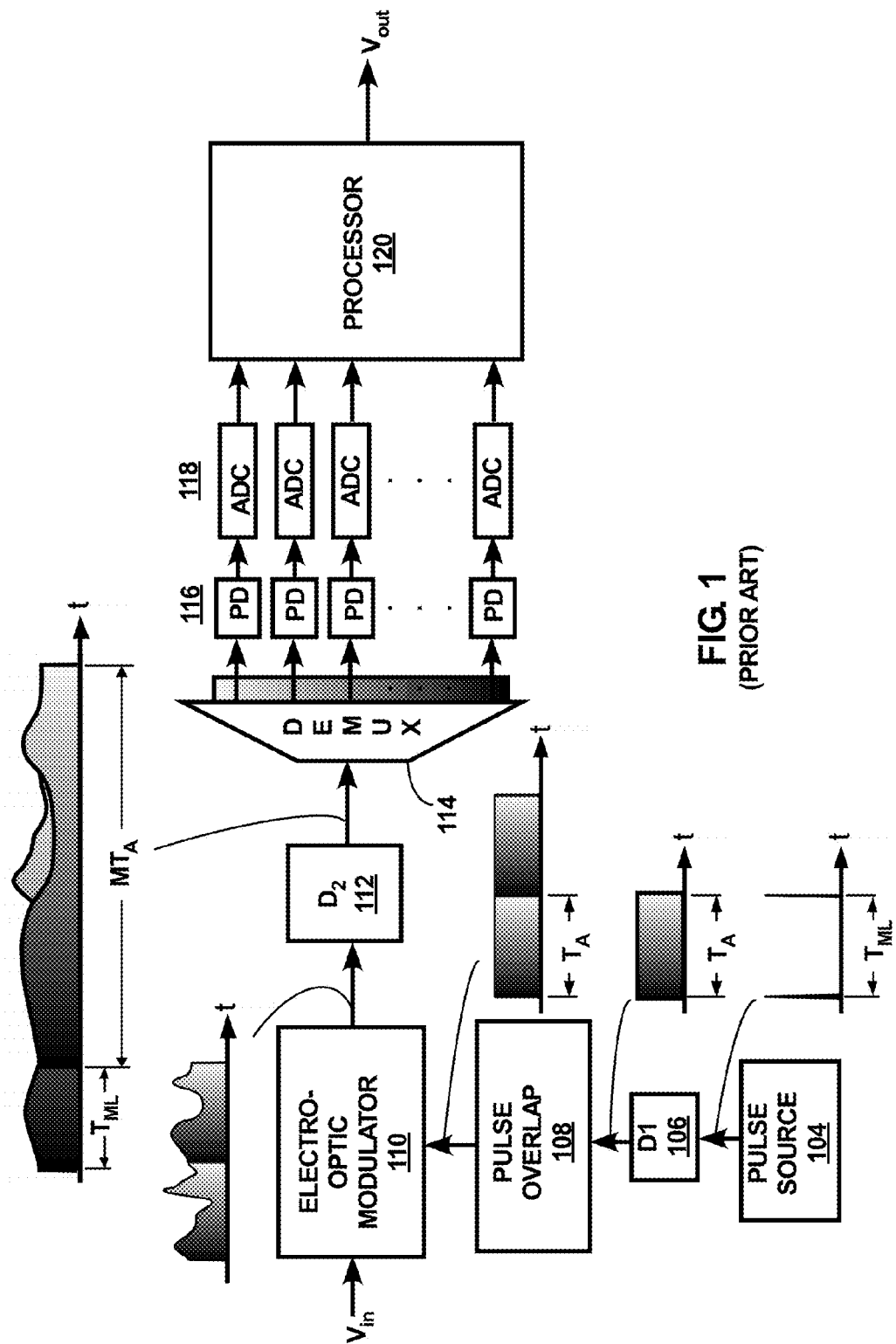
FIG. 1 is a schematic diagram of a uniformly sampled photonic TS ADC system.
Figure 2:
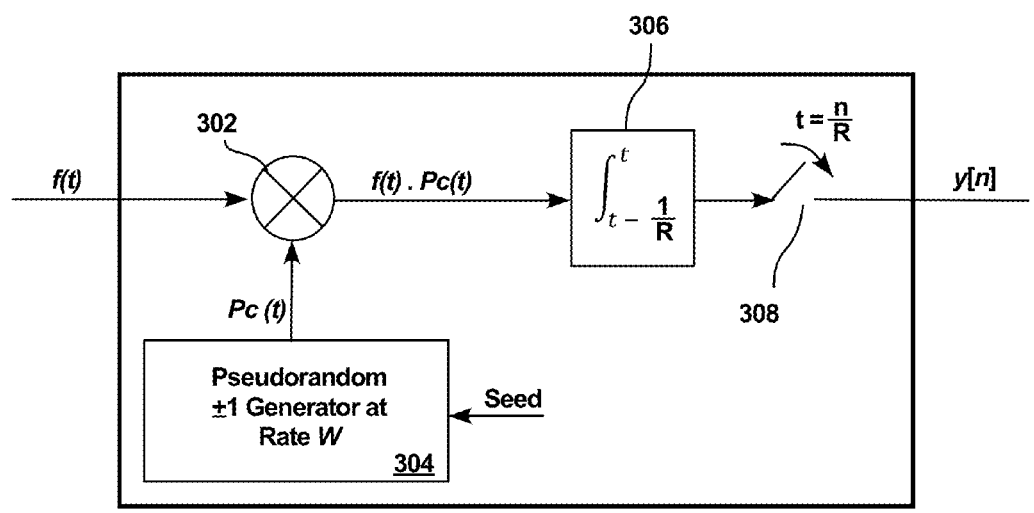
FIG. 2 is a schematic diagram of a random demodulator (RD) approach for the compressive sensing of a wideband analog input-signal.
Figures 3, 4:
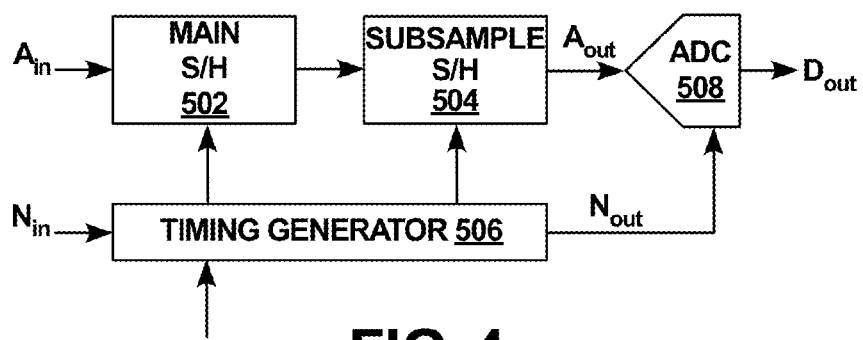
FIG. 3 is a matrix diagram illustrating the compressive sensing (CS) matrix formalism used to recover the input-signal for the RD architecture depicted in FIG. 3.
FIG. 4 is a schematic diagram of an all-electronic approach for implementing NUS via use of a S/H and Pseudo Random Bit (PSRB) generator.
Figure 5:
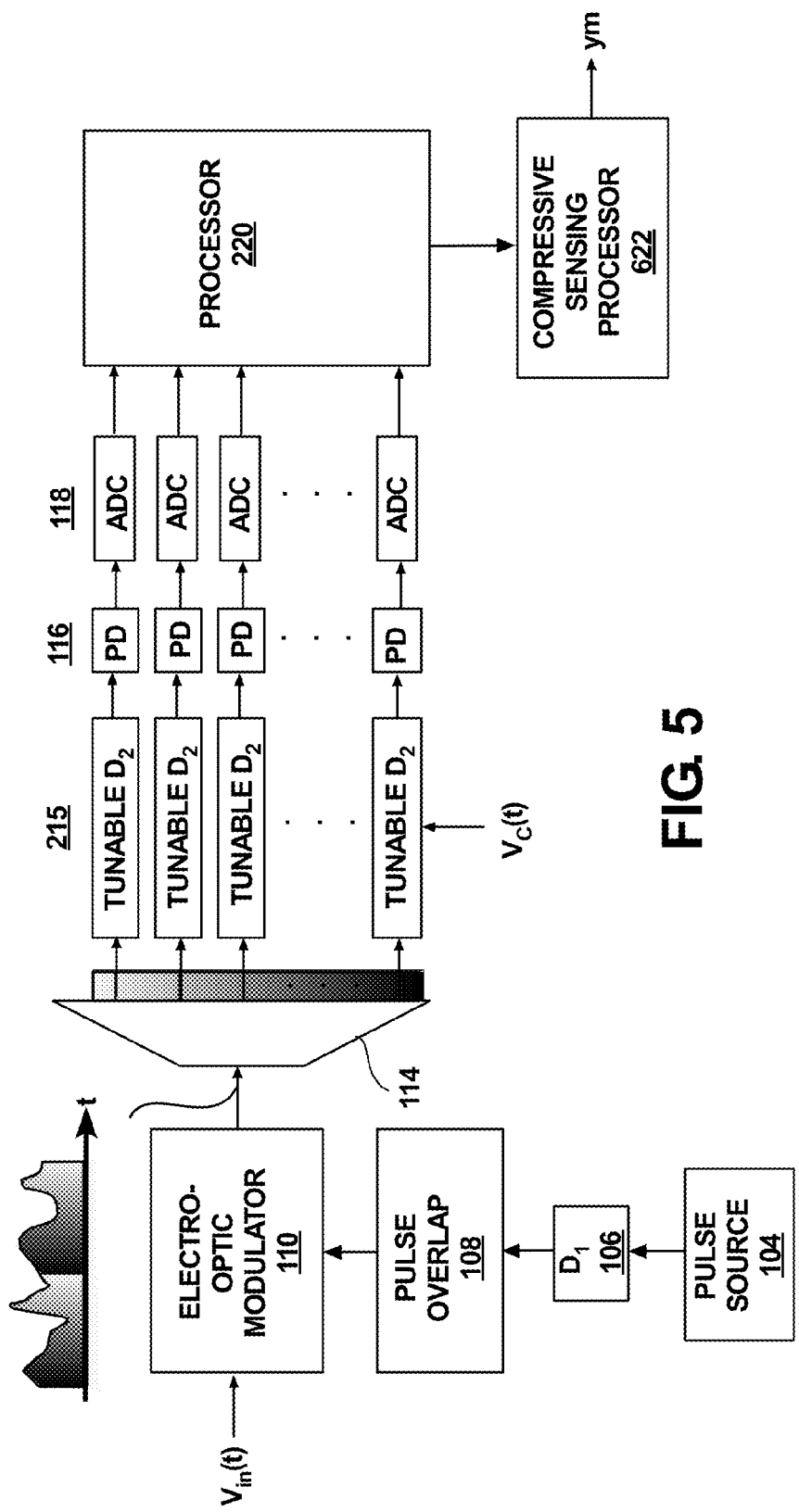
FIG. 5 is a schematic diagram of an ADC system for a frequency sparse signal comprising a NUS photonic TS ADC system as illustrated in FIG. 2, and compressive sensing, according to embodiments of the present disclosure.

FIG. 5 shows an embodiment of an architecture according to an embodiment of the present disclosure. As in FIG. 1, pulse source 104, which may be implemented by a mode-locked (ML) laser as detailed in relation with FIG. 1, is a source of low jitter short optical pulses, termed supercontinuum pulses, as shown in the waveform diagram beside the pulse source 104 in FIG. 1. Supercontinuum (pulse) source 104 is coupled to a first dispersive medium $D_1$. The first dispersive medium $D_1$ is coupled to a pulse overlapper 108. The pulse overlapper 108 is coupled to a first input terminal of an electro-optic modulator 110. A second input terminal of the Electro-Optic Modulator (EOM) 110 is coupled to a source of an input signal $V_{in}$. EOM 110 is coupled to a second dispersive medium $D_2$. The second dispersive medium $D_2$ is coupled to a demultiplexer 114. Demultiplexer 114 generates a plurality of parallel ADC λ-channels.

In FIG. 1, each λ-channel comprises a series connection of a photodetector 116 and an analog-to-digital converter 118, and each of the analog-to-digital converters 118 is coupled to a corresponding input terminal of a processor 120, where the processor 120 generates an output signal $V_{out}$.

In operation, the supercontinuum pulses from the pulse source 104 are typically 100-200 femtoseconds long. Such short pulses have a wide optical frequency bandwidth. In FIG. 1, the repeat frequency of the supercontinuum pulses is actively locked at $f_{ML}$ and has a corresponding period of $T_{ML}=f_{ML}^{-1}$ as shown in the waveform diagram next to the pulse source 104. The dispersive media 106 ($D_1$) and 112 ($D_2$) time stretch the optical signals passing through them. Light of different optical wavelengths pass through dispersive media at different speeds. In FIG. 1, different wavelengths of light in the pulses are represented by different shades of grey in which shorter wavelengths are represented in waveform diagrams as lighter shades and longer wavelengths are represented as darker shades. In normally dispersive media the light of shorter wavelengths travels slower than the light of longer wavelengths. In contrast, in anomalously dispersive media, light of shorter wavelengths travels faster than light of longer wavelengths. Anomalously dispersive media may also be used.

In FIG. 1, the first dispersive medium 106 ($D_1$) receives supercontinuum pulses and produces time-stretched pulses, termed chirped pulses, having a fixed amplitude and a width of $T_A$, typically a few nanoseconds. One chirped pulse, having a width $T_A$, is generated in response to a supercontinuum pulse occurring every $T_{ML}$. Consequently, in order to maintain continuous time (CT) ADC operation, $T_A$ and $T_{ML}$ are maintained equal: $T_A=T_{ML}$. The pulse overlapper 108 ensures that successive chirped pulses are time-adjacent to form a continuous stream of chirped pulses, as illustrated in the waveform diagram next to the pulse overlapper 108.

The electro-optic modulator 110 can be a known dual-output Mach-Zehnder electro-optic modulator (EOM). The EOM 110 receives the continuous successive chirped pulses optical signal from the pulse overlapper 108, and $V_{in}(t)$, which is an electric analog input signal $f_{sig}$. A beam splitter (not shown) divides the continuous chirped pulse optical signal into two paths. One of the paths includes a phase modulator (not shown) which modulates the phase of the optical signal in that path linearly in response to the electric analog input signal $f_{sig}$. The other path passes the optical signal in that path unchanged. The two optical signals are then combined and the phase modulated optical signal interferes with the unmodulated optical signal to form an output optical beam. As the phase difference between the two beams changes, the resulting interference reinforces and cancels, resulting in an amplitude modulated (AM) optical signal. The EOM 110 produces continuous successive time-adjacent amplitude modulated pulses of width $T_A=T_{ML}$, as illustrated in the waveform diagram above the EOM 110.

The second dispersive medium 112 ($D_2$) receives successive AM modulated chirped pulses and produces a time stretched optical signal representing them. This time-stretched signal may be considered as a plurality of overlapped respective time-stretched AM modulated chirped optical signals corresponding to each of the successive AM modulated chirped pulses, as illustrated in the waveform diagram above the dispersive medium 112 ($D_2$). The total stretch factor M for the system of FIG. 1, is $M=1+D_2/D_1$.

The demultiplexer 114 is an array waveguide grating demultiplexer (AWG). The AWG demultiplexer separates the signal from the second dispersive medium 112 ($D_2$) into a plurality of parallel channels, termed λ-channels, each carrying optical signals from a corresponding band of wavelengths. Typically, the optical bandwidth $\Delta\lambda_{opt}$ of each λ-channel is around 30-40 nm. In FIG. 1, the λ-channel AWG demultiplexer 114 receives the time-stretched optical signal from the second dispersive medium 112 ($D_2$), and generates a plurality of output optical signals each carrying a different λ-channel. In FIG. 1, the topmost λ-channel carries the smallest wavelength optical signals, the next λ-channel down carries the next larger wavelength optical signals, and so forth, as illustrated by the gray scale at the output terminals of the AWG demultiplexer 114.

In FIG. 1, each λ-channel from the demultiplexer 114 is coupled to a corresponding photodetector 116. The plurality of photodetectors 116 produce respective electric output signals representing the intensity of the optical signals received by the corresponding photodetector 116. The electric output signals from the plurality of photodetectors 116 are coupled to corresponding analog-to-digital converters (ADC). Because the input signal $V_{in}(t)$ has been time stretched, the ADCs 118 may operate at a relatively low speed, as discussed below.

The processor 120 is an electronic digitizer bank which receives the digitized samples from the plurality of ADCs 118, and performs the processing necessary to produce a digital representation of the relatively high bandwidth input signal $V_{in}(t)$. The processor 120 may be implemented using a field programmable logic array (FPLA) or other similar technology. An implementation of processor 120 is capable of producing 1-1.5 giga-samples-per-second (GSPS) with 9-9.5 effective number-of-bits (ENOB). As described above, a reference synthesizer (not shown) synchronizes the operation of the processor 120 and the pulse source 102.

FIG. 5 is a schematic diagram of a photonic TS ADC system designed to accomplish non-uniform sampling (NUS) with use of electrically tunable dispersion media. In FIG. 5, elements which are similar to those in FIG. 1 are designated by the same reference number and are not described in detail below. One skilled in the art understands that other elements may be included in an ADC system as illustrated in FIG. 1, and will understand what those elements are, what their function is, where they are required, and how to design and implement them. For example, reference clock generators may be used to synchronize the operation of the various elements of the ADC system. Such clock generators will preferably be a reference synthesizer with low phase noise. Further, various optical filters and amplifiers may be inserted as necessary.

In FIG. 5, the series connection of the pulse source 104, the first dispersive medium 106 ($D_1$), the pulse overlapper 108, and the electro-optical modulator 110 produce continuous successive AM modulated chirped pulses, as illustrated in the waveform diagram above the electro-optic modulator 110, and explained in more detail above with respect to FIG. 1.

In FIG. 5, the successive AM modulated chirped pulses are provided to the array waveguide grating (AWG) demultiplexer 114. As described above with respect to FIG. 1, the AWG demultiplexer 114 generates a plurality of λ-channel optical signals of respective wavelengths. The topmost λ-channel carries the smallest wavelength optical signals, the next λ-channel down carries the next larger wavelength optical signals, and so forth. Each λ-channel comprises a series connected tunable second dispersive medium 215 (D$_2$), a photodetector 116 and an analog-to-digital converter (ADC) 118. The respective ADCs 118 are coupled to the processor 220.

In operation, each tunable second dispersive media 215 controllably time-stretches the received optical signals, in a manner discussed in more detail below. The respective time-stretched optical signals are converted to analog electrical signals representing the intensity of the optical signal by the photodetectors 116. The analog electrical signals are sampled and converted to digital signals by the ADCs 118, which samples at a fixed frequency which is relatively low compared with the frequency and/or bandwidth of the input signal V$_{in}$(t). The samples from the ADCs 118 in all the λ-channels are provided to the processor 220, which processes those samples to produce a digital output signal V$_{out}$ which represents the input signal V$_{in}$.

The amount of time stretch provided by the second tunable dispersive media 215 (D$_2$) is controlled by a control signal V$_C$(t). By varying the control signal V$_C$(t), the time-stretch provided by the plurality 215 of second dispersive media may be changed during operation. Because the time-stretching of the AM modulated chirped pulses may be changed in response to the control signal V$_C$(t), the sampling of the chirped pulses is changed in a corresponding manner. If an AM modulated chirped pulse is time stretched into a pulse shorter than average, then fewer samples are taken of that pulse by the (uniformly clocked) ADCs 116. Consequently the sampling frequency is lower and the sampling periods are longer for that pulse. Similarly, if a different AM modulated chirped pulse is time-stretched into a pulse longer than average, than more samples are taken of that pulse: i.e. the sampling frequency is higher and the sampling periods are shorter for that pulse. The time-stretch of the successive AM modulated chirped pulses is controlled to be non uniform and random by the control signal V$_C$(t). According to an embodiment of the present disclosure, the processor 220 is an electronic digitizer bank which receives the digitized samples from the plurality of ADCs 118, and performs the processing necessary to produce an output signal V$_{out}$ which is a digital representation of the input signal V$_{in}$(t).

According to an embodiment of the present disclosure, the photonic TS ADC subsystem of FIG. 5 can accomplish non uniform and randomized time-stretching via the use of the tunable dispersive elements D$_2$ 215. As described above, non uniform time-stretching permits randomized sampling of a time-stretched analog-input amplitude modulated onto a chirped optical carrier. Theoretical works that analyze non-uniform sampling in general and various methods in particular are based on the fact that sampling in the time domain is essentially a multiplication operation:

$$x_s(t)=x(t)s(t)$$

where the sampling function is typically represented as a pulse train:

$$s(t) = \sum_{-\infty}^{\infty} \delta(t - t_n)$$

In normal uniform sampling, t$_n$=nT for some fixed sample interval T. A crucial difference in non-uniform sampling is that t$_n$≠nT for all n. The sampling intervals from one time instant to the next can then be specified in any appropriate manner, the most common being zero crossings of some deterministic or pseudo-random pattern, or derived from a random distribution. Typically, a jittered random sampling t$_n$=nT+τ$_n$ is common because of natural hardware timing considerations. Note that τ$_n$ is a random variable. There is a finite probability that it can go into neighboring "bins". However, by defining σn appropriately, that probability is negligibly small. (Even if crosstalk occurs, aliases are still suppressed.)

For non-uniform sampling mechanisms, a chief benefit, at the expense of increased synchronization issues, is the ability to suppress aliasing and thereby go beyond Nyquist uniform sampling limits. In such a case, the usual reconstruction of the band limited (to [−W,W]) sampled signal, as per the Sampling Theorem given by:

$$x(t) = \sum_{-\infty}^{\infty} x(nT)\text{sinc}(2Wt - n)$$

which generalizes to $$x(t) = \sum_{-\infty}^{\infty} x(t_n)k(t, t_n)$$

where {k(t,t$_n$)} is a reciprocal basis of the sin c expansion.

Aliased signals in a non uniform sampling case are attenuated by an amount that depends mainly on the magnitude of the characteristic function of the random distribution used for specifying the non uniform sampling jitter.

Figure 6A:
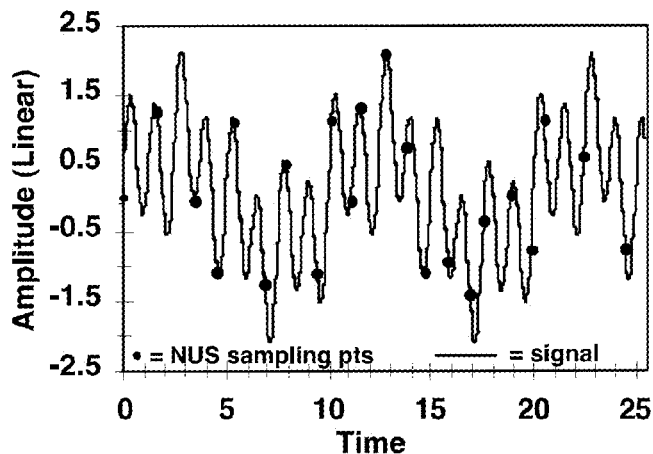
FIG. 6*a* is a waveform diagram of a time-domain waveform f(t) that is sampled non uniformly at sample times represented by dots FIG. 6*b*. is a spectrum diagram illustrating the DFT of f(t) for the case of uniform sampling at fs=1 GHz.
Figure 6B:
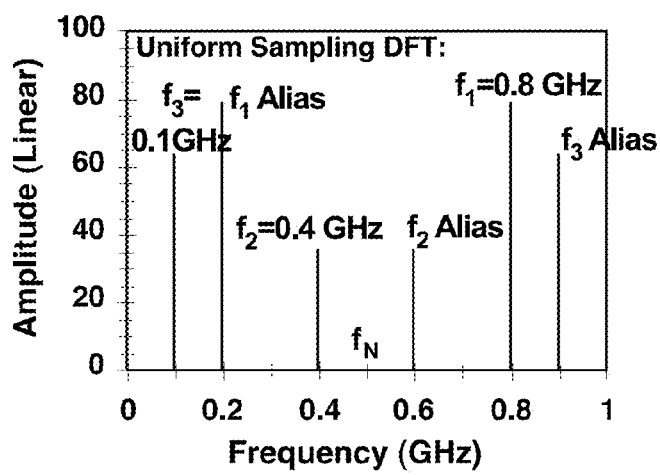
FIG. 6*c* is a spectrum diagram illustrating the DFT of f(t), showing alias suppression, when it was sampled non uniformly (see dots of FIG. 7*a*).
Figure 6C:
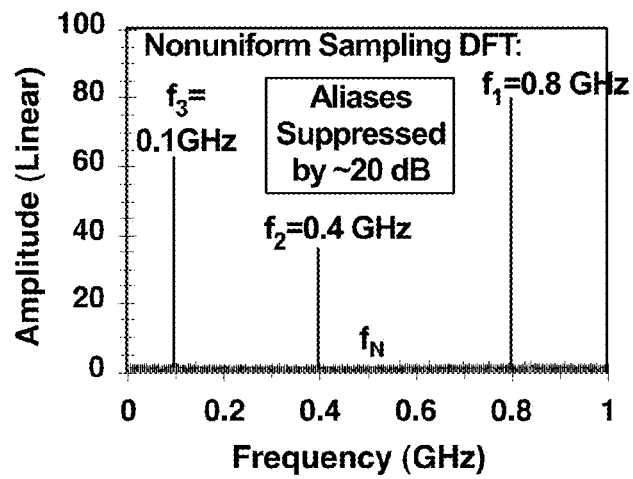

FIGS. 6A-C show the results of simulations of a non uniform random sampled system such as illustrated in FIG. 5.

FIG. 6A is a waveform diagram of a time-domain signal f(t) sampled non uniformly at sample times represented by dots; FIG. 6B is a spectrum diagram illustrating the DFT of f(t) for the case of uniform sampling at f$_S$=1 GHz; and FIG. 6C is a spectrum diagram illustrating the DFT of f(t), showing alias suppression, for the case of non uniform sampling.

More specifically, FIGS. 6A-C illustrate the alias suppression property of non uniform random sampling. FIG. 6A is a waveform diagram of a time-domain signal f(t) that consists of the summation of three harmonic signals of frequencies f$_1$=0.8 GHz with amplitude a$_1$=1, f$_2$=0.4 GHz with amplitude a$_2$=0.45, and f$_3$=0.1 GHz with amplitude a$_3$=0.8. Signal f$_1$ is deemed undersampled or subsampled because the sampling rate is f$_s$=1 GHz which is higher than the Nyquist frequency (2f$_N$) of f$_N$=0.5 GHz. The dots of FIG. 6A shows sampling-times that have been randomized according to a normal distribution with a mean μ=1 nsec and σ=0.4 nsec. Hence, the average sampling rate of the dots in FIG. 6A is 1 GHz.

FIG. 6B shows the discrete Fourier spectrum of f(t) when sampled uniformly. As the simulation shows, an alias for f$_1$, reflected down around the Nyquist frequency of f$_N$=0.5 GHz, occurs at 0.2 GHz. Aliases also occur for f$_2$ and f$_3$—both lower than f$_N$—reflected up around the Nyquist frequency f$_N$ at the frequencies of 0.6 GHz and 0.9 GHz respectively. In contrast, FIG. 6C shows the discrete Fourier spectrum of f(t) when sampled non uniformly. The simulation shows that the aliases for all three frequencies are suppressed by around 20 dB when the sampling points are randomized, as discussed above. Such simulations show that by adopting randomized sampling, the alias-free zone is expanded by around a factor of 2, with minimal tradeoff for the signal-to-noise ratio of the sampled signal.

As outlined above, FIG. 5 illustrates a photonic TS ADC system designed to implement randomized time-stretching. The tunable dispersive time-stretch (TS) elements 215 ($D_2$) are used after array waveguide grating (AWG) demultiplexer 114 to vary the time-stretch ratio M within each λ-channel so that non-uniform sampling (NUS) may be implemented by varying the control voltage $C_V(t)$ applied to $D_2$.

In FIG. 5, the output terminal of the processor 220 is coupled to an input terminal of a compressive sensing processor 622. According to an embodiment of the present disclosure, an output terminal of the compressive sensing processor 622 produces a digital signal $X_n$ representing the input signal $V_{in}(t)$.

In operation, the series connection of the pulse source 104, the first dispersive medium 106, the pulse overlapper 108, the electro-optic modulator 110 and the AWG demultiplexer 114 produces a plurality of parallel λ-channels. Respective series connections of tunable dispersive media 215, photodetectors 116 and analog-to-digital converters 118 produce corresponding digitized samples. These digitized samples are coupled to a processor 220 which generates a digital signal Ym (with m=1, Md). The digital signal from the processor 220 is supplied to a compressive sensing processor 622, which generates a digital signal stream Xn representing the input signal $V_{in}(t)$.

More specifically, a mode-locked (ML) laser 104 generates a supercontinuum (SC) pulse-train that has a spectral width of around 30-40 nm near λ around 1550 nm. The first dispersion element $D_1$ 106 chirps the pulses, so that there is a continuous time-variation of λ across a pulse. After λ-chirping, the pulse-overlapper 108 filters evenly-spaced λ-segments of the above SC, overlaps the filtered pulses at their edges, and then re-multiplexes them to form an optical input for the Mach Zehnder (MZ) electro-optic modulator (EOM) 110. The pulse-overlapping enables channel (Ch) stitching, so that an analog input signal ($V_{in}(t)$ at frequency $f_{sig}$) applied to the EOM 110 over a given time-span can be strung together after photodetection. After the analog input signal $V_{in}(t)$ is modulated onto the chirped optical carrier, the pulses are demultiplexed by the AWG λ-demultiplexer 114 before they are stretched in time by the tunable dispersion media 215 ($D_2$). The dispersion coefficient of the waveguides in the tunable dispersive media 215 ($D_2$) may be varied by applying a control voltage $V_C(t)$ to them. Because the stretch factor M is given by $M=1+D_2/D_1$, a randomized tuning of $D_2$ allows us to reconfigure M randomly and non uniformly. Specifying a control voltage $V_C(t)$ with a pseudorandom pattern allows randomized NUS, while the electronic quantizers (ADC) 118 are clocked at uniform rates.

Referring now to compressive sensing, prior techniques have been limited to reconstruction in cases involving sampled versions of bandpass signals, or multi-band signal reconstruction, or direct recovery of the modulation envelopes; all of which are limited to waveforms of very specific types. The matrix formalism for CS based reconstruction according to embodiments of the present disclosure is applicable in general to non uniform sampling, and more specifically to the photonic TS NUS approach.

Figures 7, 8:
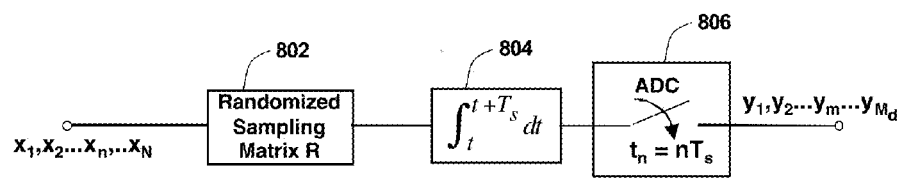
FIG. 7 is a block diagram of a random NUS CS ADC system corresponding to the matrix formalism shown in FIG. 8 for recovering an input signal $x_n$.
FIG. 8 is a matrix diagram illustrating the matrix formalism for recovering $x_n$ after random sampling.

FIG. 7 is a block diagram of a random NUS CS ADC system that underlines the rationale behind the matrix formalism as shown in FIG. 8, and FIG. 8 shows a matrix diagram illustrating a matrix formalism for recovering $x_n$ after random sampling.

According to embodiments of the present disclosure, in operation, it is considered that the system receives, for example in input of demultiplexer 114, an analog-input x(t), whose discrete time-domain sequence representation (over a time-grid with grid-interval $\Delta t_n$) is denoted $[x_n]$. It is also considered that $[x_n]$ can be obtained from its Discrete Fourier Transform (DFT): s[k]–(where s[k] is a N entries sparse vector having only k non-null entries)–by multiplying s[k] with the DFT matrix $$\left[d_{nk} = \exp\left(j\frac{2\pi}{N}nk\right)\right].$$

According to embodiments of the present disclosure, because s[k] is considered sparse, s[k] can be recovered from the measured outputs y[m] received in output of ADC 118/processor 220 via use of compressive sensing algorithms such as $l_1$ or orthogonal matching pursuit (OMP) as detailed hereafter. According to embodiments of the present disclosure, the time-grid $\Delta t_n$ of $x_n$ for n=1 ... N in the model is designed to be much finer than that dictated by the Nyquist sampling rate $f_N$ (of the time-stretched signal). According to an embodiment of the present disclosure, in a photonic TS ADC system, an output signal s[k], which is a N-entries frequency domain vector that is a reconstructed version of the input x(t), is obtained by stitching together the AWG outputs and applying compressive sensing algorithms to y[m]. Alternatively, compressive sensing can be used to reconstruct the signal received on each tunable element $D_2$, and the various reconstructed signals can be stitched together.

Referring to the matrix formalism, as shown in FIG. 8, according to an embodiment of the present disclosure, it is considered that vector Y[m], which as outlined above is a Md entries sparse time vector, corresponds to S[n], which is a N-entries sparse spectral vector, multiplied by the DFT matrix (a N by N matrix), multiplied by a random sampling N by N matrix "R", multiplied by a Md by N mixing matrix "Φ".

According to an embodiment of the present disclosure a random sampling matrix R as illustrated in FIG. 8 is partitioned into sampling blocks, illustrated cross-hatched, and zero entries. Each sampling block corresponds to a sequential subset of samples $x_n$, and models randomized sampling. In particular, one entry $r_{ij}$ in each sampling block is selected to be 1 as specified by probability distributions such as the normal (Gaussian) distribution, with a mean μ and standard deviation σ designed to match the compression ratio and the ADC sampling time-interval $T_s$. The other entries in the sampling block are set to 0. In a photonic TS ADC system as illustrated in FIG. 5, these random sampling-times can be effected by applying a pseudo-random control voltage $V_C(t)$, generated for example by a shift-register with linear feedback, to the dispersion element $D_2$. This pseudo-random voltage only needs to be generated at a rate equal to the frequency of the stretched signal, which is $f_{sig}/M$. Hence, the use of time-stretching also substantially alleviates performance demands (such as speed and jitter) put on the pseudo-random voltage generator.

As illustrated in FIG. 7, according to an embodiment of the present disclosure, it is considered that a number of samples ($T_s/\Delta t_{grid}$) output by matrix R are randomly combined via integrator 804 to deliver a voltage that is subsequently sampled by an ADC clocked at a rate of $1/T_s$. The matrix $\Phi$ of FIG. 8, models this random mixing via integration of the elements for an N×1 (N-entries) vector $[x_n']=R[x_n]$ with a sequence of is in each row of $\Phi$. Matrix $\Phi$ is an $M_d \times N$ matrix, where $N>>M_d$. Specifically, the number of is in each sequence of a row is equal to $T_s/\Delta t_{grid}$. For a uniformly clocked ADC, the sequence of is for different rows of $\Phi$ are equal in length, and given by the designed compression ratio $N/M_d$, and the m+1 th row of $\Phi$ has N/Md of consecutive unit entries starting in column (mN/Md)+1 for each m=0, 1, Md−1

As shown in FIG. 8, according to an embodiment of the present disclosure, sampling processing yields an $M_d \times 1$ data-vector $[y_m]$ to which one can apply CS algorithms (such as $l_1$ or orthogonal matching pursuit (OMP)) and use matrixes $\Phi$, R and DFT to recover the sparse-vector $[s_k]$. For the photonic TS ADC system shown in FIG. 5, the integration (i.e., random mixing) may be accomplished after photodetection (116) and sampling by an electronic quantizer (118). (Hence, embodiments of the present disclosure exchange the order of integration and A/D conversion illustrated in FIG. 7.)

According to an embodiment of the present disclosure, the electronic quantizer 118 (of FIG. 5) samples at two times the stretched frequency $f_{sig}/M$ if uniform Nyquist sampling is implemented. If, in addition, randomized non uniform sampling according to embodiments of the present disclosure is implemented, the sampling rate of the ADC may be further reduced.

Referring back to FIG. 7, alias suppression may be achieved with sampling rates half the Nyquist rate. Finally, the dimension $M_d$ of the data-vector for the photonic TS ADC subsystem is determined by the number of samples integrated after A/D conversion. This, in turn, sets the length of the sequence of is in the $\Phi$ matrix of FIG. 8.

Referring back to FIGS. 6A-C, alias-free subsampling results for an analog-input signal when the sampling times of an ADC are randomized. Therefore, randomized subsampling enables reduction of the time-stretch ratio M because the same back end ADC bank can sense a wider bandwidth signal spectrum, with minimal tradeoff in ENOB. The above reduction in the stretch ratio M, in turn, allows for cutting down, in proportion, the number of parallel channels needed to construct a CT photonic TS ADC subsystem. This further simplifies the calibration and stitching of the parallel channels in the non uniformly sampled TS ADC subsystem. In addition the CS formalism for reconstructing an input-signal $[x_n]$ from measured data collected via non uniform sampling according to embodiments of the present disclosure (FIG. 8) may be employed with well-known CS techniques such as $l_1$ or orthogonal matching pursuit (OMP) to recover $[s_k]$, and hence $[x_n]$, from the measured output of the ADC subsystem.

By adopting a CS approach, the analog-to-digital converters (ADCs) 118 (FIG. 5) may be clocked at a uniform rate that is much lower than the Nyquist rate of the input signal $V_{in}(t)$. The random sampling can be accomplished with the use of non-uniform time-stretching in a photonic time-stretch (TS) ADC system. Embodiments of the present disclosure further comprises a CS-based matrix formalism and ADC back end design for recovering a signal x(t), which is assumed to be frequency-sparse but could occupy a wide instantaneous bandwidth (IBW). Specifically, the output $[y_m]$ of the present ADC design according to principles of embodiments of the present disclosure consists of randomized linear projections of the time-domain sequence $x_n$. Using the discrete Fourier transform (DFT), the present disclosure transforms $x_n$ to a N-entries sparse vector $[s_k]$ in the frequency domain. Because $[s_k]$ is sparse (i.e., it has only K out of N non-zero elements, where K<<N), CS-based techniques such as $l_1$ or orthogonal matching pursuit (OMP) may be applied to obtain $[s_k]$ from the measured output $[y_m]$. Other CS based techniques can be used, such as L2 norm, iterative hard thresholding (IHT), etc. The input-signal $[x_n]$ is reconstructed from $[s_k]$ (i.e., transformed back to the time domain) via use of the DFT matrix.

In summary, the present disclosure is a hardware-compressed approach to accomplish wideband A/D conversion. By implementing non uniform sampling, alias suppressing can be achieved even if subsampled, i.e. sampled at a rate lower than the conventional Nyquist rate. The present disclosure further comprises reconstructing a randomly sampled signal via use of CS algorithms.

The invention claimed is:

1. A back end-circuit for randomized non uniform and alias-free subsampling, comprising: an analog-to-digital converter (ADC) configured for sampling an input signal at random non uniform times;
    a compressive sensing processor, coupled to the ADC, to recover a sparse spectral representation of the input signal; and
    a Fourier transformer for converting the sparse spectral representation to a time sampled representation of the input signal.

2. The circuit of claim 1, wherein said sampling at random non uniform times has a sampling rate below the Nyquist rate.

3. The circuit of claim 1 wherein the ADC comprises a photonic time-stretch random non uniform sampling ADC including a variable dispersive medium.

4. The circuit of claim 1, wherein said analog-to-digital converter (ADC) is configured for time-stretching the input signal prior to sampling the input signal at random non uniform times.

5. The circuit of claim 4, wherein said analog-to-digital converter (ADC) is configured for randomly time-stretching the input signal prior to sampling the input signal at uniform times.

6. The circuit of claim 1, wherein said compressive sensing processor is provided for, using a compressive sensing algorithm, recovering said sparse spectral representation of the input signal by, considering that the output of said ADC is equal to said sparse spectral representation of the input signal multiplied by a DFT matrix, multiplied by a random sampling matrix, multiplied by a mixing matrix.

7. The circuit of claim 6, wherein
    said sparse spectral representation of the input signal comprises N-entries;
    said output of said ADC comprises Md, where Md<<N;
    said DFT matrix is a N by N matrix;
    said random sampling is a N by N matrix, said matrix being partitioned into a plurality of sampling blocks and zero entries, in which the plurality of sampling blocks contain a plurality of entries in which one entry in each sampling block is selected to be 1 in accordance with a probability distribution function having a mean and standard deviation, and the remainder of entries in that sampling block are 0; and
    said mixing matrix is a Md by N matrix, where the m+1 th row has N/Md of consecutive unit entries starting in column (mN/Md)+1 for each m=0, 1, Md−1, representing mixing of a plurality of samples of the input signal.

8. The circuit of claim 1 wherein the compressive sensing processor implements one of an $l_1$ or orthogonal matching pursuit (OMP) compressive sensing technique.

9. A processor-implemented method for reconstructing a randomly sampled input signal, comprising executing on a processor the steps of:

generating a N-entries sparse spectral vector representing a sparse spectral representation of a randomly sampled input signal; and transforming the sparse spectral vector to a Md-entries time sampled representation of the input signal using a N by N DFT matrix;

wherein said generating a N-entries parse spectral vector comprises:

receiving a Md entries sparse time vector representing random samples of the input signal uniformly arranged in time, where Md<<N;

generating a random sampling N by N matrix, representing a random sampling of the input signal, said matrix being partitioned into a plurality of sampling blocks and zero entries, in which the plurality of sampling blocks contain a plurality of entries in which one entry in each sampling block is selected to be 1 in accordance with a probability distribution function having a mean and standard deviation, and the remainder of entries in that sampling block are 0;

generating a Md by N mixing matrix, where the m+1 th row has N/Md of consecutive unit entries starting in column (mN/Md)+1 for each m=0, 1, Md−1, representing mixing of a plurality of samples of the input signal; and using a compressive sensing algorithm, generating said N-entries sparse spectral vector from the Md entries sparse time vector, considering that said Md entries sparse time vector is the N-entries sparse spectral vector multiplied by the N by N DFT matrix, multiplied by the random sampling N by N matrix, multiplied by the Md by N mixing matrix.

10. The processor implemented method of claim 9, wherein said compressive sensing algorithm is one of an $l_1$ or orthogonal matching pursuit (OMP) algorithm.

11. The processor implemented method of claim 9, wherein the N by N random sampling matrix represents a random sampling of a set of N regularly distributed samples of an input signal, wherein the multiplication of a vector representing a set of N regularly distributed samples of an input signal by the random sampling matrix produces a randomly sampled vector of same size N having randomly chosen entries replaced by zeros.

* * * * *